United States Patent [19]

Saitoh et al.

[11] Patent Number: 4,710,654
[45] Date of Patent: Dec. 1, 1987

[54] DELAY CIRCUIT INCLUDING AN IMPROVED CR INTEGRATOR CIRCUIT

[75] Inventors: Takashi Saitoh; Nobuya Niizaki, both of Yokohama; Hideho Yamamura, Tokyo; Shinichi Hayashi, Isezaki, all of Japan

[73] Assignees: Hitachi, Ltd., Tokyo; Hitachi Electronics Engineering Co., Ltd., Kanagawa, both of Japan

[21] Appl. No.: 647,484

[22] Filed: Sep. 5, 1984

[30] Foreign Application Priority Data

Sep. 5, 1983 [JP] Japan .................................. 58-162081
Sep. 26, 1983 [JP] Japan .................................. 58-176279

[51] Int. Cl.$^4$ .......................... H03K 5/13; H03K 5/01; H03K 3/26
[52] U.S. Cl. ..................................... 307/601; 307/268; 307/608; 307/320; 328/127

[58] Field of Search .............. 307/601, 268, 603, 234, 307/605, 608, 320, 590, 597, 285; 328/127

[56] References Cited

U.S. PATENT DOCUMENTS 3,748,499 7/1923 Schaffner .......................... 307/320

Primary Examiner—Stanley D. Miller
Assistant Examiner—Timothy P. Callahan
Attorney, Agent, or Firm—Antonelli, Terry & Wands

[57] ABSTRACT

The delay circuit of the present invention has a CR integrator including a variable capacitance diode. This CR integrator is arranged between the first and second comparators. By applying a constant DC comparison voltage to the other input terminal of the second comparator, delay amounts can be selectively changed for the leading and trailing edges of the pulse waveform.

2 Claims, 12 Drawing Figures

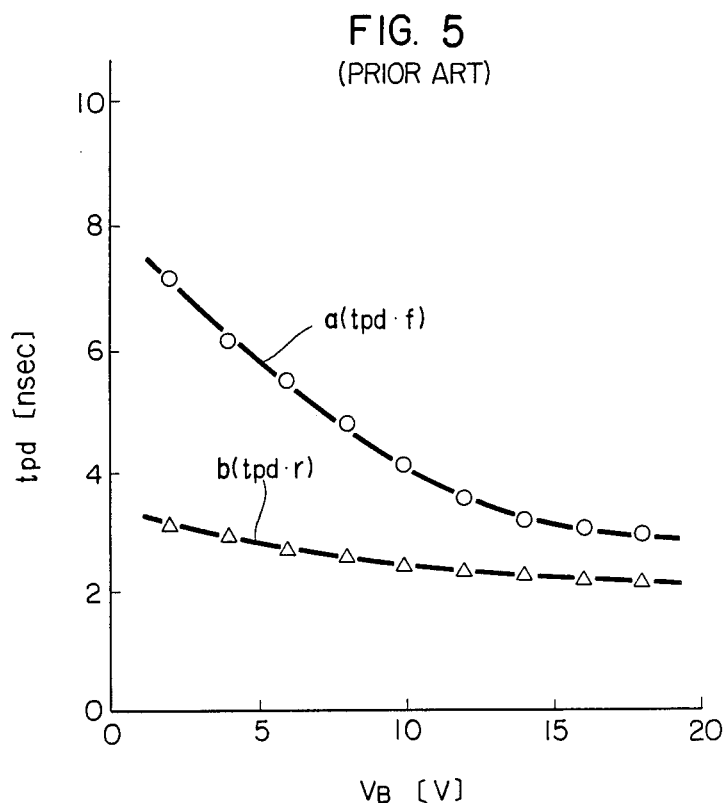
FIG. 5
(PRIOR ART)
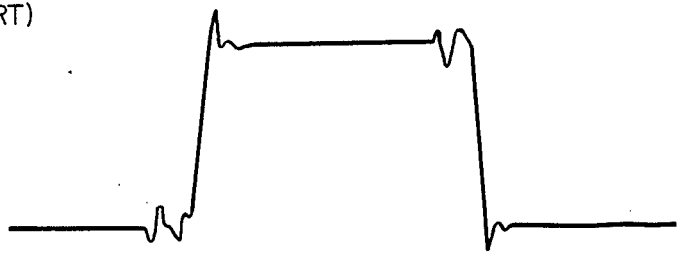
FIG. 6
(PRIOR ART)
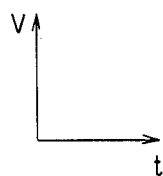

DELAY CIRCUIT INCLUDING AN IMPROVED CR INTEGRATOR CIRCUIT

BACKGROUND OF THE INVENTION

1. Field of the Invention

The present invention relates to a delay circuit and, more particularly, to a delay circuit in which delay amounts can be selectively changed for the leading and trailing edges of a pulse waveform.

2. Description of the Prior Art

Recently, as processing speed and the degree of accuracy of logic circuits have become high, the timing accuracy is becoming a significant subject. However, the necessary timing accuracy for a signal is not always obtained as required because of variations in characteristics of component parts, lengths of wiring and floating capacitances of wirings used in the circuit. Due to this, it is necessary to adjust the signal timing so as to match a desired timing by inserting a delay circuit into the signal path for changing the delay amount for every circuit.

FIG. 1 is a block diagram showing one example of a conventional delay circuit, which is a variable delay circuit to attain the above object.

This circuit has a CR integrator consisting of resistors $R_A$ and $R_B$ and variable capacitance diodes $D_{VCA}$ and $D_{VCB}$ between buffer amplifiers IC1 and IC2 having the function as comparators, and controls the delay time by varying a value of bias voltage $V_B$ to the variable capacitance diodes $D_{VCA}$ and $D_{VCB}$.

FIG. 2 shows a timechart for the circuit of FIG. 1 and indicates the concept of the delay time control. The propagation delay times in the buffer amplifiers IC1 and IC2 are omitted for easy understanding.

It is now assumed that an input signal as shown in FIG. 2(a) is inputted to an input terminal IN of the buffer amplifier IC1. As shown in FIG. 2(b), the rise time and fall time of the pulse at input terminals A and B of the buffer amplifier IC2 become long under the action of the above-mentioned integrator. By shaping the waveform by the buffer amplifier IC2, the pulse which was delayed by only $\Delta t$ as compared with the input signal of FIG. 2(a) is obtained as shown in FIG. 2(c).

In such a conventional circuit, there is a disadvantage such that the delay amounts can not be independently changed for the leading and trailing edges of a pulse waveform.

FIG. 3 shows a prior developed circuit which can independently change the delay amount for leading and trailing edges of a pulse waveform.

A differential amplifier is used and pulses are inputted to the input terminals IN and $\overline{\text{IN}}$ of the buffer circuit (hereinbelow, referred to as the first comparator) 1 having the voltage comparing function such as a comparator, line receiver or the like, and its output terminals are connected to resistors 3 and 4 and a variable capacitance diode 5, and resistors 6 and 7 and a variable capacitance diode 8 as integrators.

The variable reverse bias voltage $V_B$ is applied to the variable capacitance diodes 5 and 8. By varying the voltage $V_B$, the capacitances of the variable capacitance diodes 5 and 8 are changed and the time constant of the circuit is also changed. Therefore, the leading and trailing times of the waveform at an input 9 on the inverting side of a second comparator 2 similar to the above are changed as indicated by the broken line of FIG. 4(a).

In FIG. 4, the solid lines indicate the waveforms when the capacitances of the variable capacitance diodes 5 and 8 are small, while the broken lines represent the waveforms when those capacitances are large.

On the other hand, in this circuit, the waveform at an input 10 on the non-inverting side of the second comparator 2 is as follows.

Namely, since a diode 11 is connected in parallel to the resistor 3, when an output of the first comparator 1 changes from a Lo level to a Hi level, the diode 11 is made conductive, thereby allowing the variable capacitance diode 5 to be charged within a short time.

On the contrary, when the output of the first comparator 1 changes from a Hi level to a Lo level, the diode 11 is made non-conductive since the reverse bias voltage is applied thereto. Thus, the charged in the variable capacitance diode 5 are gradually discharged by the resistors 3 and 4 and the waveform becomes as shown in FIG. 4(b).

As described above, the waveforms as shown in FIGS. 4(a) and 4(b) are inputted to the second comparator 2. The waveforms as shown in FIG. 4(c) are outputted from the second comparator 2.

In this way, although the delay amount of this circuit is changed by changing the capacitances of the variable capacitance diodes, this is very effective with respect to the trailing edges of the input waveforms.

Namely, the leading and trailing edges can be separated and the delay amounts can be controlled.

FIG. 5 shows the characteristics of this circuit.

Namely, FIG. 5 shows the relations between the bias voltage $V_B$ which is applied to the variable capacitance diodes 5 and 8 and a propagation delay time $t_{pd}$ in this circuit when emitter coupled logic (ECL) line receivers HD100114 (made by Hitachi, Ltd.) were used as the first and second comparators 1 and 2, and 1SV124 (Hitachi, Ltd.) were used as the variable capacitance diodes 5 and 8, and 1SS165 (Hitachi, Ltd.) was used as the diodes 11.

It will be understood from the graphs that when the bias voltage $V_B$ was changed from 2 V to 14 V, a change amount of the propagation delay time at the trailing edge (hereinbelow, referred to as $t_{pd}\cdot f$) changes from 7.1 nsec to 3.2 nsec as shown by a curve a in FIG. 5.

At this time, a change amount of the propagation delay time at the leading edge (hereinbelow, referred to as $t_{pd}\cdot r$) changes from 3.12 nsec to 2.28 nsec as indicated by a curve b in the diagram.

These characteristic curves are the curves when one desires to actively change the trailing edge. When, for example, an IC is tested, in order to improve the timing accuracy by controlling each edges independently, it is desirable that the timing of the leading edge does not change while the timing of the trailing edge is controlled.

Now, assuming that a degree of separation $\eta = \Delta t_{pd}\cdot f / \Delta t_{pd}\cdot r$ on the basis of a ratio of the change amounts of the delay times between the $t_{pd}\cdot r$ at the leading edge and the $t_{pd}\cdot f$ at the trailing edge, the characteristics of the circuit are more excellent as a value of this degree of separation $\eta$ is large.

In the delay circuit of FIG. 3, the degree of separation $\eta$ is a value of 4.74 as will be obtained from the characteristic curves of FIG. 5.

However, in case of this value, when one desires to change the trailing edge, the leading edge will also have been changed in association with that change. Therefore, when the timings are adjusted with a high degree of accuracy and at a high speed, this value of the degree of separation $\eta$ is insufficient.

Namely, this delay circuit has an insufficient point such as the lack of degree of separation.

In addition, FIG. 6 shows the output waveform of the delay circuit of FIG. 3. It can be seen from this diagram that the output waveform has ringing due to the influence of the diode 11 connected in parallel to the resistor 3.

Due to this, there is a fear that the circuit of the second comparator 2 on the post side causes a malfunction and when a pulse width is short, there is another fear of occurrence of timing distortion.

Although when the diode 11 is removed, the waveform ringing becomes small, in such a case, there is a disadvantage such that the separation of delay amounts of the leading and trailing edges as mentioned above cannot be obtained.

Further, in this delay circuit, the number of parts is large and the wiring pattern becomes complicated, causing a disadvantage such that the miniaturization is difficult.

As described above, in the conventionally developed delay circuit mentioned above, there are problems such that, fundamentally, a degree of separation is small and the output waveform is distorted and the number of parts is large and the wiring pattern becomes complicated; therefore, it is insufficient although it can be practically used.

SUMMARY OF THE INVENTION

It is an object of the present invention to solve the disadvantages of the delay circuit conventionally developed and to provide a delay circuit having good selectively such that the respective delay amount for the leading and trailing edges of the pulse signal waveform are independently controllable.

To accomplish this object, the delay circuit according to the present invention is constituted in the manner such that a CR integrator including a variable capacitance diode is arranged between an output of a first comparator having an open emitter or open collector output and a non-inverting or inverting input of a second comparator, and a constant DC comparison voltage is applied to the other input terminal of the second comparator, and that the delay time is changed by changing the applied voltage to the variable capacitance diode.

Additional explanation will be made as follows.

The above object is attained by constituting the variable delay circuit as follows.

Namely, the delay time is varied by the variable capacitance diode and the separation between the leading and trailing edges is realized by use of the characteristics of the output transistor in the comparator.

BRIEF DESCRIPTION OF THE DRAWINGS

FIG. 5 is a delay characteristic diagram thereof;

FIG. 6 is an output waveform diagram thereof;

DESCRIPTION OF THE PREFERRED EMBODIMENTS

Each embodiment according to the present invention will now be described with reference to the respective drawings.

Figure 7:
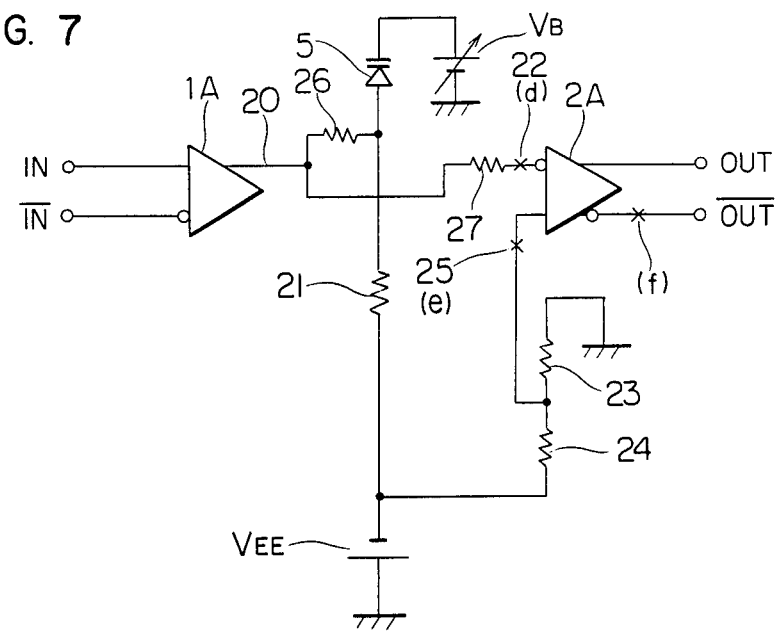
FIG. 7 is a circuit arrangement diagram of a delay circuit according to one embodiment of the present invention.
Figure 8:
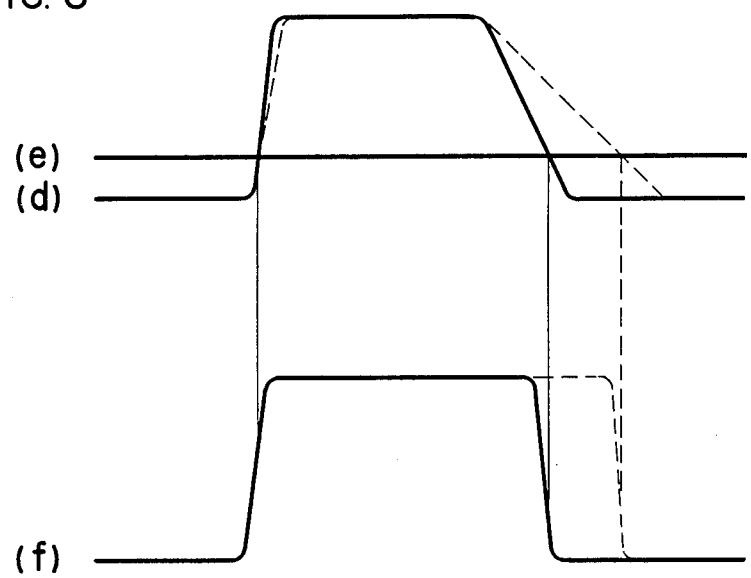
FIG. 8 is a diagram showing each waveform in the above circuit.
Figure 8:
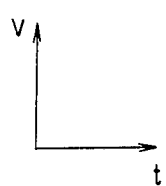
Figure 9:
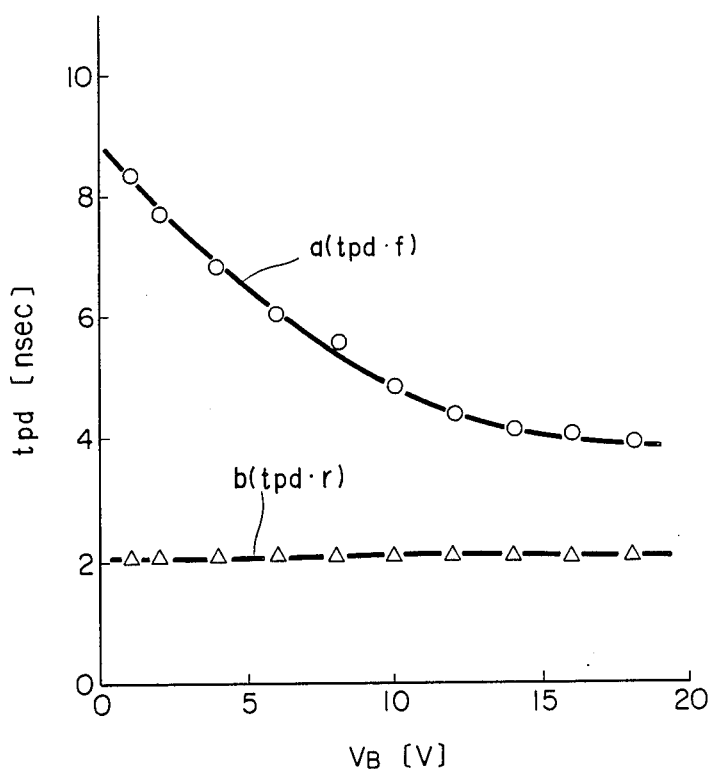
FIG. 9 is a delay characteristic diagram thereof.
Figure 10:
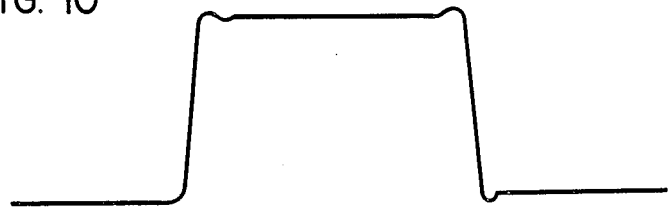
FIG. 10 is an output waveform diagram thereof.
Figure 10:
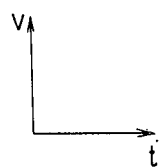

First, FIG. 7 is a circuit arrangement diagram of a delay circuit according to a first embodiment of the present invention. FIG. 8 is a diagram showing each waveform in that circuit. FIG. 9 is a delay characteristic diagram thereof. FIG. 10 is an output waveform diagram thereof.

Figure 1:
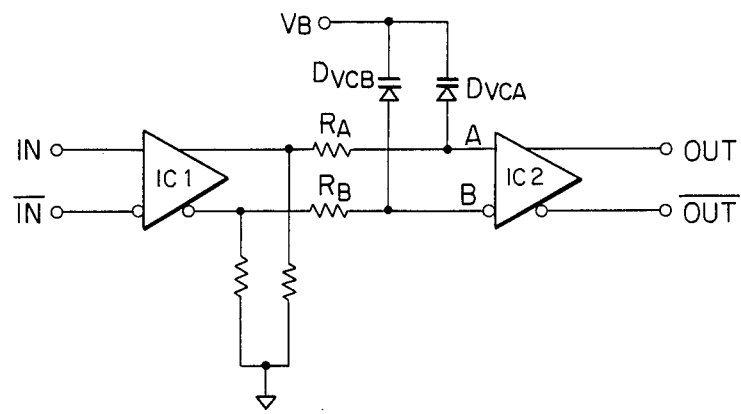
FIG. 1 is a circuit diagram of an example of a conventional delay circuit.
Figure 2:
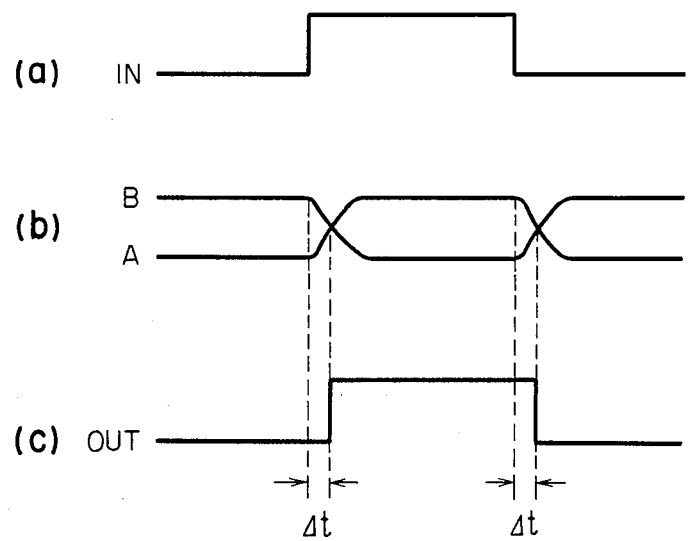
FIG. 2 is a timechart thereof.
Figure 3:
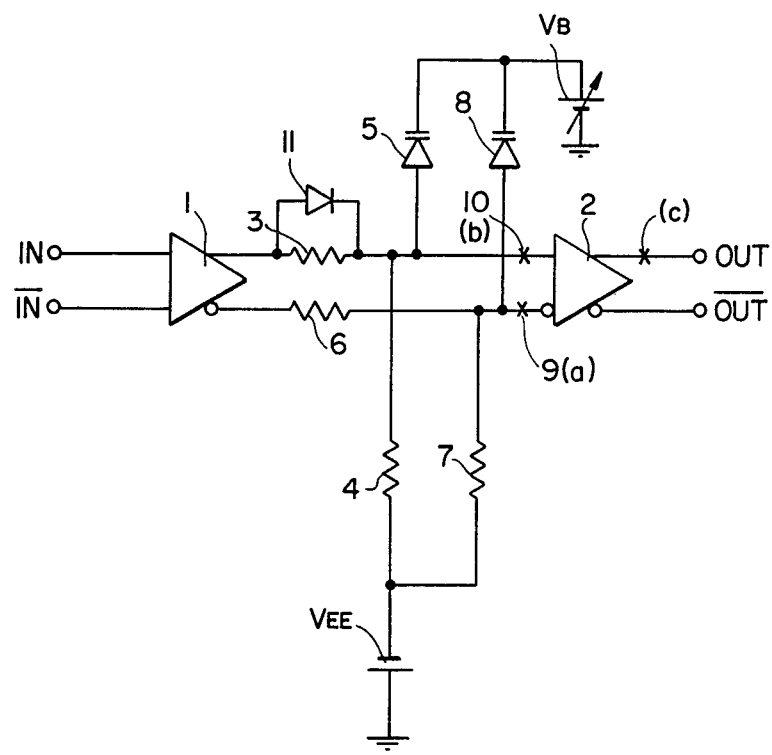
FIG. 3 is another circuit diagram of an example of a conventional delay circuit.
Figure 4:
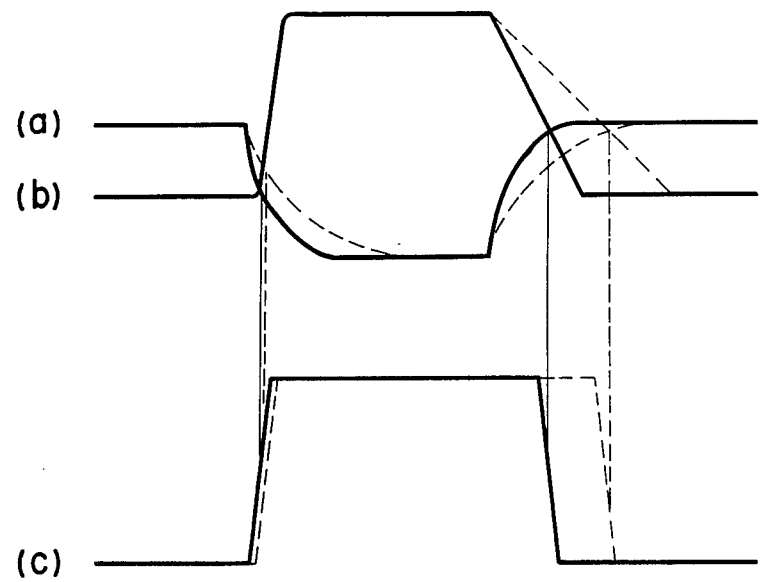
FIG. 4 is a diagram showing each waveform in the circuit shown in FIG. 3.
Figure 4:
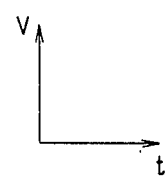

In the diagrams, the same parts and components as those shown in FIG. 3 are designated by the same reference numerals, in which numerals 1A and 2A denote first and second comparators; 20 is an output portion; 21 a second resistor; 22 an input on the inverting side of the second comparator 2A; 23, 24 and 27 resistors; 25 an input on the non-inverting side of the second comparator 2A; and 26 a first resistor.

The delay circuit according to this embodiment uses, as the first and second comparators, the comparators having an open emitter output.

Namely, a CR integrator consisting of a variable capacitance diode 5 and the first resistor 26 connected to the anode of the diode 5 is arranged between the output portion 20 of the first comparator 1A which has the open emitter output and the inverting side input 22 of the second comparator 2A. Namely the second resistor 21 is arranged between the node of the variable capacitance diode 5 and first resistor 26 which is connected to a negative power source $V_{EE}$. The node of the output portion 20 of the first comparator 1A and the first resistor 26 is connected to the inverting side input 22 of the second comparator 2A through the resistor 27. A DC potential of which the voltage of the power source $V_{EE}$ was divided by the resistors 23 and 24 with respect to a constant DC comparison voltage is applied to the non-inverting side input 25 as the other terminal of the second comparator 2A.

In this circuit, the delay time is changed by changing the variable reverse bias voltage $V_B$ which is applied to the variable capacitance diode 5.

IN and $\overline{\text{IN}}$ are the inputs on the non-inverting and inverting sides of the first comparator 1A, while OUT and $\overline{\text{OUT}}$ are the outputs on the non-inverting and inverting sides of the second comparator 2A.

With such an arrangement input (IN, $\overline{\text{IN}}$) and output (OUT, $\overline{\text{OUT}}$) pulses are differential signals.

First, when the input IN to the first comparator 1A changes from a Lo level to a Hi level, the output transistor in the first comparator 1A is made conductive since the output stage of the first comparator 1A is the open emitter.

Therefore, the output impedance is extremely small and the input 22 to the second comparator 2A becomes as shown in FIG. 8(d) and the rise time is the same as that of the rise time of the output of the first comparator 1A.

Next, when the input IN to the first comparator 1A are changes from a Hi level to a Lo level, the output transistor in the first comparator 1A becomes almost the non-conducting state, namely, the output impedance becomes large. Consequently, the input 22 to the second comparator 2A falls as shown in FIG. 8(d) due to time constants of the resistor 21 and a capacitance of a variable capacitance diode 5 in FIG. 7.

In addition, the variable reverse bias voltage $V_B$ is applied to the variable capacitance diode 5. By changing this voltage $V_B$, the capacitance is changed.

In place of the circuit of FIG. 7, any circuit which can apply the reverse bias voltage to the variable capacitance diode 5 may be used. For example, it is also possible to constitute the circuit in the manner such that the cathode of the variable capacitance diode 5 of FIG. 7 is connected to the first and second resistors 26 and 21 and the negative voltage of $V_B$ is applied to the side of the anode.

FIG. 8 shows the input and output waveforms at the points indicated by x in FIG. 7. The solid line indicates the waveform when the capacitance of the variable capacitance diode 5 is small, while the broken line represents the waveform when it is large.

As already mentioned above, a DC voltage as shown in FIG. 8(e) is applied as a comparison voltage to the other input 25 of the second comparator 2A, and a waveform of which the comparison was made and the waveform was shaped such as shown in FIG. 8(f) is outputted from the output OUT.

In the delay circuit according to this embodiment, the DC comparison voltage was applied by dividing the $V_{EE}$ voltage by the resistors 23 and 24, but it may be applied by another method. However, as can be seen from FIG. 8, to cooperate with the input waveform of the second comparator 2A, the degree of separation becomes better as the DC comparison voltage approaches a level close to that of the Lo level. Unfortunately, it becomes weak due to noise. Therefore, it is preferable that the level of this DC comparison voltage is set to a potential which is larger than the Lo level by about 100 to 200 mV and which is lower than the intermediate value between the Hi and Lo levels in consideration of the noise and voltage variation.

Although the first resistor 26 and the resistor 27 are unnecessary for the fundamental operation, they are used to prevent the overshoot of the input 22 of the second comparator 2A. In addition, the second resistor 21 constitutes the CR integrator together with the variable capacitance diode 5 and also serves as the pull-down resistor of the transistor which is the emitter follower output stage of the first comparator 1A.

Curves a and b in FIG. 9 show the characteristics of the delay circuit according to the foregoing embodiment.

In this circuit, the relation between the bias voltage $V_B$ and the propagation delay time $t_{pd}$ is shown when the emitter coupled logic (ECL) line receivers HD100114 (made by Hitachi, Ltd.) were used as the comparators and 1SV124 (Hitachi, Ltd.) were used as the variable capacitance diodes.

Change amounts of the propagation delay times of the leading and trailing edges when the bias voltage was changed from 2 V to 14 V are such that $t_{pd}·r = 0.04$ nsec and $t_{pd}·f = 3.62$ nsec and a degree of separation $\eta$ is 90.5.

As mentioned before, a degree of separation $\eta$ of the delay circuit conventionally developed is $\eta = 4.74$ from FIG. 5, while according to the delay circuit of this embodiment, its performance is improved by about 19 times better than that of the conventional example.

FIG. 10 shows the output waveform of the delay circuit of the first embodiment. It can be understood that the waveform with good quality having no ringing of the waveform is obtained. This is because the number of parts is less than that of the delay circuit conventionally developed and additional elements which will give the wrong effects to realize the high-speed circuit having the fast rise and fall times are not included.

In the delay circuit according to the foregoing embodiment, the CR integrator was arranged between the output of the first comparator and the inverting input of the second comparator. However, a similar effect will be obtained if a delay circuit is constituted such that the CR integrator is arranged between the output of the first comparator and the non-inverting input of the second comparator.

Figure 11:
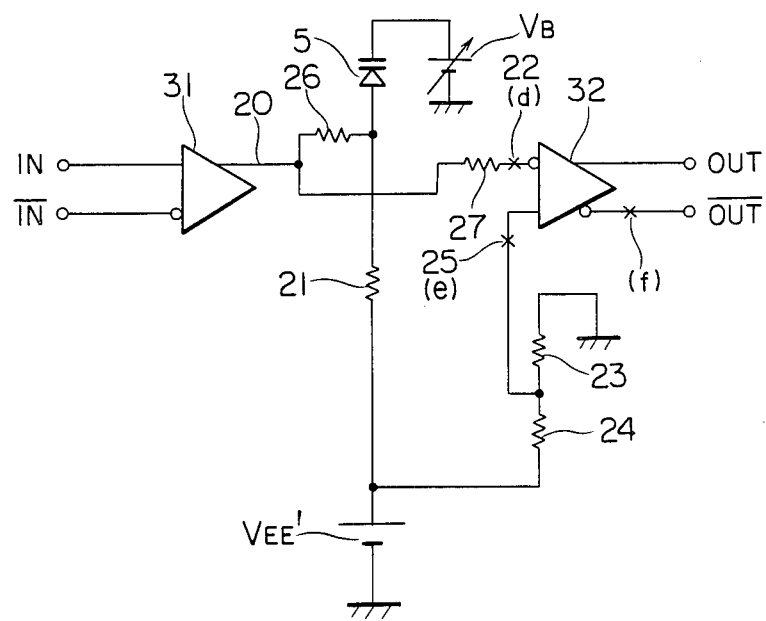
FIG. 11 is a circuit arrangement diagram of a delay circuit according to another embodiment of the invention.

Next, FIG. 11 is a circuit arrangement diagram of the delay circuit according to a second embodiment of the invention.

In the diagram, the same parts and components as those shown in FIG. 7 are designated by the same reference numerals, in which 31 and 32 denote first and second comparators with respect to the open collector outputs. $V_{EE}'$ is a power source.

In the delay circuit of this second embodiment, it is possible to obtain the operation and characteristics which are similar to those in the case where the comparators of the open emitter shown in FIG. 7 were used.

Figure 12:
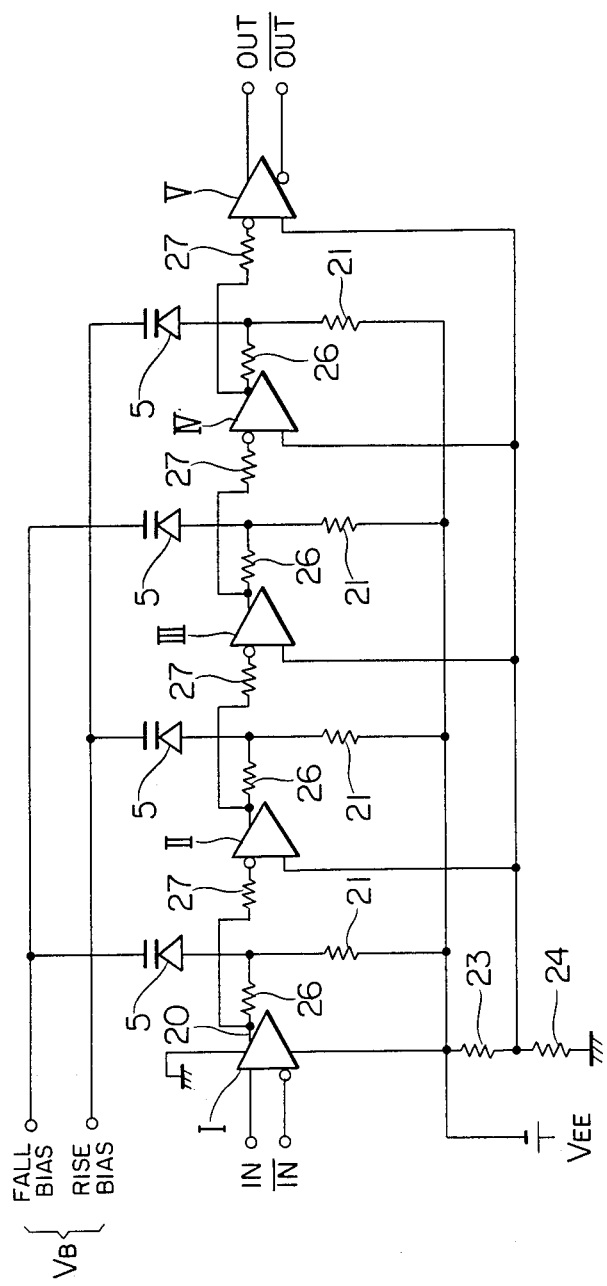
FIG. 12 is a circuit arrangement diagram to which the delay circuit according to the invention is applied.

Further, FIG. 12 is a circuit arrangement diagram according to an example of application to allow the leading and trailing times to be independently delayed. This can be implemented by exchanging the non-inverting and inverting sides of the delay circuit shown in FIG. 7 and by inverting the phase.

In FIG. 12, the same parts and components as those shown in FIG. 7 are designated by the same reference numerals, in which I to V correspond to the above-mentioned first and second comparators 1A and 2A.

Namely, the comparators I and II, II and III, III and IV, and IV and V are a set of first and second comparators, respectively.

In addition, the delay circuit according to the comparators of open collectors can be applied on the basis of the similar embodiment.

We claim:

1. A delay circuit comprising:
   a first comparator having at least one input for receiving an input signal for the delay circuit, and also having an open emitter output;
   a second comparator having a non-inverting input and an inverting input, one of which is connected to the output of said first comparator, and an output for producing an output signal delayed from said input signal of said first comparator;
   a CR integrator circuit comprising a first resistor, an second resistor and a variable capacitance diode, of which one electrode of said first resistor is connected to the output of said first comparator and the other electrode is connected to one electrode of said variable capacitance diode, wherein one electrode of said second resistor is connected to a node between said first resistor and said variable diode and the other electrode of said second resistor is connected to a voltage supply, said first resistor controlling the rise-time of the output signal of said first comparator, and said second resistor controlling the fall-time of said output signal of said first comparator according to the time constant produced with said second resistor and the variable capacitance diode;

a variable voltage source connected to the other electrode of the variable capacitance diode to control the capacitance of said variable capacitance diode; and a reference voltage source connected to the other input terminal of said second comparator which is not connected to the first comparator.

2. A delay circuit comprising:

a first comparator having at least one input for receiving an input signal for the delay circuit, and also having an open collector output;

a second comparator having a non-inverting input and an inverting input, one of which is connected to the output of said first comparator, and an output for producing an output signal delayed from said input signal of said first comparator;

a CR integrator circuit comprising a first resistor, a second resistor and a variable capacitance diode, of which one electrode of said first resistor is connected to the output of said first comparator and the other electrode is connected to one electrode of said variable capacitance diode, wherein one electrode of said second resistor is connected to a node between said first resistor and said variable diode and the other electrode of said second resistor is connected to a voltage supply, said first resistor controlling the rise-time of the output signal of said first comparator, and said second resistor controlling the fall-time of said output signal of said first comparator according to the time constant produced with said second resistor and the variable capacitance diode;

a variable voltage source connected to the other electrode of the variable capacitance diode to control the capacitance of said variable capacitance diode; and a reference voltage source connected to the other input terminal of said second comparator which is not connected to the first comparator.

* * * * *